(12) United States Patent
Womac

(10) Patent No.: US 7,792,512 B2
(45) Date of Patent: *Sep. 7, 2010

(54) SYSTEM AND METHOD FOR DYNAMIC IMPEDANCE TUNING TO MINIMIZE RETURN LOSS

(75) Inventor: Michael D. Womac, McKinney, TX (US)

(73) Assignee: Microtune (Texas), L.P., Plano, TX (US)

( * ) Notice: Subject to any disclaimer, the term of this patent is extended or adjusted under 35 U.S.C. 154(b) by 190 days.

This patent is subject to a terminal disclaimer.

(21) Appl. No.: 12/123,764

(22) Filed: May 20, 2008

(65) Prior Publication Data

US 2009/0289735 A1 Nov. 26, 2009

Related U.S. Application Data

(63) Continuation of application No. 11/116,987, filed on Apr. 28, 2005, now Pat. No. 7,376,407.

(51) Int. Cl.
*H04B 1/18* (2006.01)
(52) U.S. Cl. .................. 455/289; 455/293; 455/340; 333/32
(58) Field of Classification Search ............... 455/3.01, 455/3.02, 280, 289, 293, 296, 334, 338, 340; 333/32
See application file for complete search history.

(56) References Cited

U.S. PATENT DOCUMENTS

| | | | | |
|---|---|---|---|---|
| 4,061,981 | A | 12/1977 | Endres et al. | 325/419 |
| 5,883,553 | A | 3/1999 | Tsumura | 333/174 |
| 5,973,557 | A | 10/1999 | Miyaji et al. | 330/51 |
| 6,255,906 | B1 | 7/2001 | Eidson et al. | 330/124 R |
| 6,400,224 | B2 | 6/2002 | Gharpurey | 330/252 |
| 6,639,465 | B2 | 10/2003 | Samelis et al. | 330/129 |
| 7,030,691 | B2 | 4/2006 | Kim | 330/51 |
| 7,376,407 | B2 | 5/2008 | Womac | 455/289 |
| 2005/0124303 | A1 | 6/2005 | Bengtson et al. | 455/91 |

OTHER PUBLICATIONS

*Notification of Transmittal of the International Search Report and the Written Opinion of the International Searching Authority* for International Application No. PCT/US06/14350; 9 pages, Sep. 13, 2007.

*Primary Examiner*—Nguyen Vo
(74) *Attorney, Agent, or Firm*—Fulbright & Jaworski L.L.P.

(57) ABSTRACT

A system for tuning an impedance at a node comprises a first component associated with a first impedance when the first component is operating and a second impedance when the first component is not operating. The system further comprises a second component coupled to the first component at a node. The second component is associated with a third impedance when the second component is operating and a fourth impedance when the second component is not operating. An impedance tuning circuit is coupled to the second component at the node and operable to tune an impedance at the node based at least in part upon a plurality of the first impedance, the second impedance, the third impedance, and the fourth impedance.

12 Claims, 1 Drawing Sheet

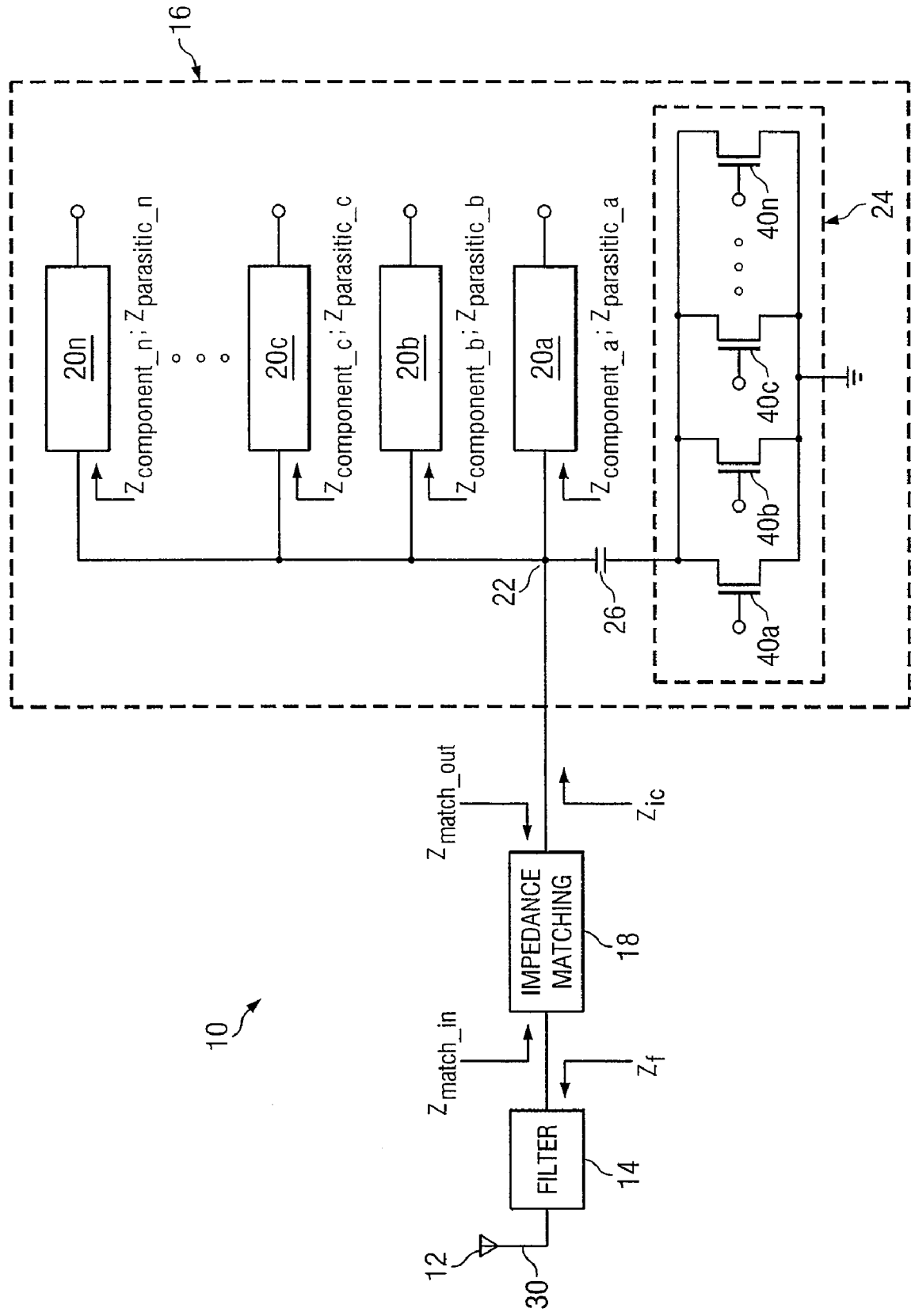

SYSTEM AND METHOD FOR DYNAMIC IMPEDANCE TUNING TO MINIMIZE RETURN LOSS

RELATED APPLICATION

This application is a continuation of U.S. application Ser. No. 11/116,987, filed Apr. 28, 2005 entitled "System and Method for Dynamic Impedance Tuning to Minimize Return Loss", now U.S. Pat. No 7,376,407 B2.

TECHNICAL FIELD OF THE INVENTION

This invention relates in general to signal processing and more particularly to a system for dynamic impedance tuning to minimize return loss.

BACKGROUND OF THE INVENTION

Impedance is a measure of the overall opposition of a circuit to current. It is like resistance, but it also takes into account the effects of capacitance and inductance. Impedance is more complex than resistance because the effects of capacitance and inductance vary with the frequency of the current passing through the circuit and this means impedance varies with frequency. The effect of resistance is constant regardless of frequency. Therefore, by adding or subtracting capacitance or inductance to a circuit, we can change the impedance of the circuit.

SUMMARY OF THE INVENTION

In accordance with one embodiment of the present invention, a system for tuning an impedance at a node comprises a first component associated with a first impedance when the first component is operating and a second impedance when the first component is not operating. The system further comprises a second component coupled to the first component at a node. The second component is associated with a third impedance when the second component is operating and a fourth impedance when the second component is not operating. An impedance tuning circuit is coupled to the second component at the node and operable to tune an impedance at the node based at least in part upon a plurality of the first impedance, the second impedance, the third impedance, and the fourth impedance.

In accordance with another embodiment of the present invention, a system for minimizing return loss comprises a plurality of components coupled to each other at a node. Each component is associated with a first impedance when the component is operating and a second impedance when the component is not operating. The system further comprises an impedance tuning circuit coupled to the plurality of components at the node and an impedance matching circuit coupled to the node. The impedance tuning circuit is operable to tune an impedance at the node based upon at least some of the first impedances of the plurality of components and further based upon at least some of the second impedances of the plurality of components. The impedance matching circuit is operable to minimize a return loss of the system across a broadband range of frequencies based at least in part upon the impedance at the node.

The following technical advantages may be achieved by some, none, or all of the embodiments of the present invention. Impedance matching can be difficult when the input impedance of a circuit can vary according to the operation of the components in the circuit. In the system of the present invention, an impedance tuning circuit facilitates the tuning of an input impedance of an integrated circuit to within a consistent range of input impedances no matter which components of the integrated circuit are operating. As a result, an input matching circuit that is external to the integrated circuit may be used to minimize the return loss of the system across a broadband range of frequencies. These and other advantages, features, and objects of the present invention will be more readily understood in view of the following detailed description and the drawings.

BRIEF DESCRIPTION OF THE DRAWINGS

For a more complete understanding of the present invention and its advantages, reference is now made to the following description, taken in conjunction with the accompanying drawing, in which:

FIG. 1 illustrates one embodiment of a system 10 according to the present invention.

DETAILED DESCRIPTION OF EXAMPLE EMBODIMENTS OF THE INVENTION

FIG. 1 illustrates a system 10 that includes an input device 12 coupled to a filter 14 which is further coupled to components of an integrated circuit 16 by an impedance matching circuit 18. Integrated circuit 16 comprises components 20a-20n coupled to each other at an input node 22. Circuit 16 further comprises an impedance tuning circuit 24 that is AC-coupled to input node 22 using a capacitor 26. In general, the filter 14 exhibits a filter output impedance, $Z_f$, and the components of the integrated circuit 16 exhibit an integrated circuit input impedance, $Z_{ic}$. Impedance tuning circuit 24 facilitates control of $Z_{ic}$ at input node 22 such that impedance matching circuit 18 can be used to minimize the return loss of system 10 across a broadband range of frequencies, no matter which components 20a-20n are turned on or off.

Input device 12 comprises a terrestrial antenna, a cable input, a satellite dish, or any other suitable device for receiving a broadband signal 30 from a variety of sources. Signal 30 comprise video and/or audio data carried on analog or digital signals, such as radio frequency (RF) signals over a frequency range. In this regard, signal 30 comprises a modulated signal. In one embodiment, signal 30 comprise signals in the television band. For example, in the United States, television signals are generally transmitted in a band from 48 MHz to 852 MHz. In other countries, television signals are generally transmitted in a band from 470 Mhz to 900 Mhz. Filter 14 comprises any suitable number and combination of frequency selective components that may be arranged to create an appropriate filter response. In a particular embodiment, filter 14 comprises a bandpass filter. However, it should be understood that any suitable component with an output impedance may be substituted for filter 14 in system 10 without departing from the scope of this disclosure.

Impedance matching circuit 18 comprises any suitable number and combination of resistors, capacitors and inductors used to transform the filter output impedance, $Z_f$, to the integrated circuit input impedance, $Z_{ic}$. For example, the impedance matching circuit input impedance, $Z_{match\_in}$, should substantially equal the conjugate of the filter output impedance, or, $Z_f^*$. Moreover, the impedance matching circuit output impedance, $Z_{match\_out}$, should substantially equal the conjugate of the integrated circuit input impedance, or, $Z_{ic}^*$. The conjugate of either $Z_f$ or $Z_{ic}$, (e.g., $Z_f^*$ and $Z_{ic}^*$ respectively), has substantially the same magnitude but the opposite reactance as its counterpart.

Components 20a-20n comprise amplifiers, attenuators, mixers, filters, or any other suitable circuit components that are coupled to input node 22. Each component 20 is associated with a first impedance, $Z_{component}$, when the component is turned on or is operational, and is further associated with a second impedance, $Z_{parasitic}$, when the component is turned off or not operational. The second impedance may also be referred to as a parasitic impedance. The first and second impedances of the components 20a-20n contribute to the integrated circuit input impedance, $Z_{ic}$. The impedances of the components 20, whether they are turned on or off, are not necessarily equal to each other.

As the integrated circuit 16 has different components 20 that may be turned on or off based on circuit operation, the integrated circuit input impedance, $Z_{ic}$, varies according to operation. For example, in a particular mode of operation, when component 20a is operating, components 20b-20n are not operating. In this mode of operation, $Z_{component}$ of component 20a and the sum of $Z_{parasitic}$ for components 20b-20n contribute to $Z_{ic}$. In another mode of operation, when component 20b is operating, component 20a and components 20c-20n are not operating. In this mode of operation, $Z_{component}$ of component 20b and the sum of $Z_{parasitic}$ for component 20a and components 20c-20n contribute to $Z_{ic}$. Moreover, as impedance necessarily varies with frequency, the integrated circuit input impedance, $Z_{ic}$, also varies with the range of broadband frequencies associated with signal 30.

Impedance tuning circuit 24 comprises any suitable number and combination of resistors, capacitors, and inductors used to create a variable impedance, $Z_{variable}$, that, when combined with the impedances created by components 20a-20n, tunes the integrated circuit input impedance, $Z_{ic}$, at input node 22. The impedance tuning circuit 24 may be created using a switchable bank of capacitors, for example. In a particular embodiment illustrated in FIG. 1, the impedance tuning circuit 24 is designed with Field Effect Transistors 40a-40n (FETs) associated with particular parasitic capacitances. By turning on or off the FETs 40a-40n, the parasitic capacitances are switched in and out of the circuit to tune the amount of impedance, $Z_{variable}$, that is contributed by the impedance tuning circuit 24 to the overall integrated circuit input impedance, $Z_{ic}$, at input node 22. In particular, switching on or off the FETs 40a-40n creates a smaller or larger capacitance associated with circuit 24. This capacitance then contributes to the variable impedance, $Z_{variable}$.

Input node 22 comprises an interface to integrated circuit 16 where each of the components 20a-20n and impedance tuning circuit 24 are coupled. In a particular embodiment, input node 22 represents a common pin within integrated circuit 16. Moreover, it is at input node 22 where the integrated circuit input impedance, $Z_{ic}$, is measured. The integrated circuit input impedance, $Z_{ic}$, can be represented by the following equation:

$$Z_{ic} = Z_{component} + \Sigma Z_{parasitic} + Z_{variable}$$

where:

$Z_{component}$=the impedance of the component 20 that is turned on;

$Z_{parasitic}$=the impedance of any given component 20 that is turned off; and $Z_{variable}$=the impedance associated with impedance tuning circuit 24.

In operation, when the components of integrated circuit 16 are coupled to the filter 14, it is desired to minimize the amount of signal 30 that is reflected back into filter 14 in relation to the amount of signal 30 that is propagated into integrated circuit 24. This ratio, expressed in decibels, of the power of the signal 30 reflected back to the power of the propagated signal 30 is referred to as return loss. Some finite amount of energy from the signal will usually be reflected, but minimizing the magnitude of that energy is important to the operation of the filter 14. If that reflected energy gets too large then it may distort the response of the filter 14. The return loss is based at least in part upon the similarity of the impedance of the transmission line and the impedance at its terminations. So, an impedance matching circuit 18 is provided to perform an impedance transformation. In particular, it can be shown mathematically that a source of power, such as input device 12 and filter 14, will deliver its maximum possible power output when the impedance of the subsequent load, such as the input impedance of integrated circuit 16 is equal to the output impedance of that source. This can be achieved through impedance matching. However, since integrated circuit 16 has different components 20a-20n that may be turned on or off based on operation, the input impedance of integrated circuit 16 varies according to operation. Therefore, in prior systems, a single external impedance matching circuit 18 was inefficient to provide an appropriate impedance transformation.

To resolve this issue, integrated circuit 24 is formed with an impedance tuning circuit 24 included on-chip. Each FET 40a-40n has a parasitic capacitance (based on the size of the FET) that is switched into or out of the circuit to provide an appropriate variable impedance, $Z_{variable}$. Alternatively, a parallel arrangement of capacitors may be switched in or out of the circuit to provide an appropriate variable impedance, $Z_{variable}$. By appropriately turning on and off certain FETs 40a-40n in the impedance tuning circuit 24 based upon which components 20a-20n are currently in or out of operation, an appropriate $Z_{variable}$ may be achieved and, consequently, a substantially consistent range of impedances may be achieved at input node 22. In this regard, an impedance matching circuit 18 may be used to perform the impedance transformation for the entire system 10, and thereby minimize the return loss of system 10 across a broadband range of frequencies associated with signal 30, no matter which components 20a-20n are in operation.

The determination of which FETs 40a-40n to turn on and off can be determined by calibrating the circuit 24 according to which components 20a-20n are turned on and off. For example, component 20a can be turned on and components 20b-20n can be turned off while integrated circuit 16 operates over a range of frequencies. The integrated circuit input impedance, $Z_{ic}$, can be determined at input node 22 and a Smith chart can be referenced to determine the appropriate level of capacitance from circuit 24 that is needed to generate a $Z_{variable}$ that can adjust $Z_{ic}$ at input node 22 to within a range of impedances that yields an acceptable return loss for system 10 over the range of frequencies. Proceeding with the calibration, component 20b can be turned on and components 20a and 20c-20n can be turned off. A Smith chart can again be referenced to determine the appropriate level of capacitance from circuit 24 that is needed to generate a $Z_{variable}$ that can adjust $Z_{ic}$ at input node 22 to within a range of impedances that yields an acceptable return loss for system 10 over the range of frequencies. This calibration process can be continued for all possible combinations of components 20a-20n being turned on or off to determine the appropriate operation of the FETs 40a-40n in the impedance tuning circuit 24. After calibration is performed, no matter which particular components 20a-20n are turned on or off, the appropriate ones of the FETs 40a-40n will be turned on and off to generate a $Z_{variable}$ that can tune $Z_{ic}$ at input node 22. As a result, the design of the impedance matching circuit 18 can be determined in response to the range of impedances that is achieved at input node 22, such that the return loss of system 10 is minimized within an acceptable range over the range of frequencies associated with signal 30.

Although the present invention has been described in detail, it should be understood that various changes, substitutions and alterations can be made hereto without departing from the scope of the invention as defined by the appended claims.

What is claimed is:

1. A method for tuning impedance at a node, comprising:
   determining a first impedance associated with a first component when the first component is operating;
   determining a second impedance associated with the first component when the first component is not operating;
   determining a third impedance associated with a second component when the second component is operating, wherein the second component is coupled to the first component at a node;
   determining a fourth impedance associated with the second component when the second component is not operating;
   tuning an impedance at the node based at least in part upon a plurality of the first impedance, the second impedance, the third impedance, and the fourth impedance.

2. The method of claim 1, wherein the second component is not operating when the first component is operating and the first component is not operating when the second component is operating.

3. The method of claim 1, wherein the second impedance and the fourth impedance each comprises a parasitic impedance.

4. The method of claim 1, wherein the impedance at the node comprises the sum of at least the first impedance, the second impedance, and the fourth impedance when the first component is operating and the second component is not operating.

5. The method of claim 1, wherein the impedance at the node comprises the sum of at least the second impedance, the third impedance, and the fourth impedance when the second component is operating and the first component is not operating.

6. The method of claim 1, further comprising:
   determining an output impedance associated with an external component;
   transforming the output impedance of the external component to the impedance at the node.

7. A method for minimizing return loss, comprising:
   determining a plurality of first impedances, each first impedance associated with a corresponding one of a plurality of components when the component is operating, wherein the components are coupled to each other at a node;
   determining a plurality of second impedances, each second impedance associated with a corresponding one of the plurality of components when the component is not operating; and
   tuning an impedance at the node based upon at least some of the first impedances and at least some of the second impedances.

8. The method of claim 7, further comprising:
   determining an output impedance associated with an external component; and
   transforming the output impedance of the external component to the impedance at the node.

9. The method of claim 7, further comprising minimizing a return loss of a system across a broadband range of frequencies based at least in part upon the impedance at the node.

10. The method of claim 7, wherein tuning the impedance at the node comprises tuning over a broadband range of frequencies.

11. The method of claim 7, wherein tuning comprises contributing a variable impedance in order to tune the impedance at the node.

12. The method of claim 7, wherein each of the second impedances comprises a parasitic impedance.

* * * * *